United States Patent
Wipiejewski

(10) Patent No.: US 6,317,446 B1
(45) Date of Patent: Nov. 13, 2001

(54) VERTICAL RESONATOR LASER DIODE AND METHOD FOR PRODUCING IT

(75) Inventor: Torsten Wipiejewski, Regensburg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/450,397

(22) Filed: Nov. 29, 1999

Related U.S. Application Data

(63) Continuation of application No. PCT/DE99/00570, filed on Mar. 3, 1999.

(30) Foreign Application Priority Data

Mar. 27, 1998 (DE) .............................. 198 13 727

(51) Int. Cl.⁷ ................. H01S 5/00; H01S 3/08
(52) U.S. Cl. ............................... 372/46; 372/96
(58) Field of Search .................. 372/50, 96, 101, 372/46

(56) References Cited

U.S. PATENT DOCUMENTS

| | | | |
|---|---|---|---|
| 5,493,577 | 2/1996 | Choquette | 372/46 |
| 5,500,868 | 3/1996 | Kurihara | |
| 5,633,527 | * 5/1997 | Lear | 372/50 |
| 5,881,085 | * 3/1999 | Jewell | 372/46 |

FOREIGN PATENT DOCUMENTS

| | | |
|---|---|---|
| 0709939A1 | 5/1996 | (EP) . |
| 0788202A1 | 8/1996 | (EP) . |
| 0791990A1 | 8/1997 | (EP) . |

* cited by examiner

Primary Examiner—Quyen Leung
(74) Attorney, Agent, or Firm—Herbert L. Lerner; Laurence A. Greenberg; Werner H. Stemer

(57) ABSTRACT

A vertical resonator laser diode has an active layer sequence for generating a laser radiation, an electrical contact layer, and a current aperture formed of a plurality of aperture layers with current passage openings of different sizes. The sizes of the current passage openings of the aperture layers increase in a direction away from the active layer sequence toward the electrical contact layer. A method for producing a vertical resonator laser diode is also provided.

12 Claims, 3 Drawing Sheets

6,317,446 B1

VERTICAL RESONATOR LASER DIODE AND METHOD FOR PRODUCING IT

CROSS-REFERENCE TO RELATED APPLICATION

This is a continuation of copending International Application PCT/DE99/00570, filed Mar. 3, 1999, which designated the United States.

BACKGROUND OF THE INVENTION

Field of the Invention

The present invention relates to a vertical resonator laser diode (VCSEL vertical-cavity surface-emitting laser), in which an active layer sequence for generating laser radiation is disposed between a first Bragg reflector layer sequence and a second Bragg reflector layer sequence, each of which has a plurality of mirror pairs. The two Bragg reflector layer sequences form a laser resonator and are disposed, together with the active layer sequence, between a first and a second electrical contact layer. One of the two Bragg reflector layer sequences is partially transmissive or semitransparent for the laser radiation generated in the active layer sequence. On at least one of the two Bragg reflector layer sequences, a current constriction device, called "current aperture" below, is provided which serves to concentrate the operating current lowing through the active layer sequence during operation of the laser diode and thus to limit the cross section of the pumped active region of the active layer sequence. The current aperture has at least one aperture layer disposed between one of the electrical contact layers and the active layer sequence. Furthermore, the invention relates to a method for producing such a vertical resonator laser diode.

Such vertical resonator laser diodes with a current aperture 119 are disclosed in U.S. Pat. No. 5,493,577. One example of such a vertical resonator laser diode is illustrated schematically in FIG. 3. In this example, the current constriction (the current flow is indicated by the arrows 130) to the desired pumped region 121 of the active layer sequence 103 is effected through the use of two thin AlAs or AlGaAs aperture layers 105, which are oxidized except for the respective current passage opening 116.

The two aperture layers 105 are disposed on mutually opposite sides of the active layer sequence 103, in each case between the active layer sequence 103 and the Bragg reflector layer sequence 102, 104. The Bragg reflector layer sequences 102, 104 each essentially include a plurality of mirror pairs, each of which has two AlGaAs layers having different band gaps. The Bragg reflector layer sequences 102 is disposed on a substrate 120. The bottom of the substrate 120 is provided with a contact layer 114.

In the oxidized annular regions 122, which define the size and form or shape of the current passage openings 116, the AlAs or AlGaAs aperture layers 105 have a very high electrical resistance. As a result, the pump current 130, which is supplied through a contact layer 115, essentially flows only in the region of the current passage openings and thus in the desired pumped region 121 through the active layer sequence 103.

With regard to a simple production of such vertical resonator laser diodes, the AlAs or AlGaAs aperture layers 105 have a higher Al content than the AlGaAs layers of the mirror pairs of the Bragg reflector layer sequences 102, 104. This is because the lateral oxidation rate of $Al_xGa_{1-x}As$ layers during a heat treatment in a humid atmosphere depends on the Al content (the higher the Al content, the higher the oxidation rate). For this reason, the AlAs or AlGaAs aperture layers 105 as described in the U.S. Pat. No. 5,493,577, can be produced in a simple manner after the production of the laser diode layer structure with the active layer sequence 103, the Bragg reflector layer sequences 102, 104 and the AlAs or AlGaAs layers for the aperture layers 105 by an oxidation of the entire layer structure in a humid atmosphere.

Furthermore, the thin AlAs or AlGaAs aperture layers 105 cause only minor optical losses in the laser resonator. Consequently, it is possible to produce vertical resonator laser diodes having a very high efficiency and small threshold currents.

A disadvantage of the above-described structure of vertical resonator laser diodes, however, is that a severe current crowding occurs at the edges of the current passage openings 116 during operation. This current crowding causes a severe local heating of the Bragg reflector layer sequences 102, 104 and of the active layer sequence 103 in the region of these edges, which accelerates the ageing of the laser diode component. Furthermore, there is also the risk of the locally very high current density leading to the generation and migration of crystal defects, which reduces the lifetime and reliability of the vertical resonator laser diodes.

SUMMARY OF THE INVENTION

It is accordingly an object of the invention to provide a vertical resonator laser diode which overcomes the above-mentioned disadvantages of the heretofore-known vertical resonator laser diodes of this general type and in which local current crowding is minimized. It is a further object of the invention to provide a simple method for manufacturing a vertical resonator laser diode of this type.

With the foregoing and other objects in view there is provided, in accordance with the invention, a vertical resonator laser diode, including a laser resonator having a first Bragg reflector layer sequence and a second Bragg reflector sequence, the first and second Bragg reflector layer sequences each having a plurality of mirror pairs; an active layer sequence disposed between the first and second Bragg reflector layer sequences for generating a laser radiation, the active layer sequence having a pumped active region and having a side, one of the first and second Bragg reflector layer sequences being partially transmissive for the laser radiation; a first electrical contact layer and a second electrical contact layer, the first and second Bragg reflector layer sequences and the active layer sequence being disposed between the first and second electrical contact layers; and a current aperture provided at least on the side of the active layer sequence for limiting the pumped active region of the active layer sequence by concentrating an operating current flowing through the active layer sequence during a laser operation, the current aperture including aperture layers disposed between one of the first and second electrical contact layers and the active layer sequence, the aperture layers being formed with current passage openings having different sizes, the sizes of the current passage openings increasing in a direction away from the active layer sequence toward one of the first and second electrical contact layers.

Accordingly, in the case of the vertical resonator laser diode of the type mentioned above, it is provided that the current aperture is formed by a plurality of individual, mutually separated or isolated aperture layers having current passage openings of different sizes, which are disposed between one of the electrical contact layers and the active layer sequence, and that the sizes of the current passage openings of these aperture layers increase (in steps) in the direction away from the active layer sequence toward the electrical contact layer. In particular, the sizes of the current passage openings, in the case of more than two aperture layers, permanently increase proceeding from a smallest passage opening, adjacent to the active layer sequence, toward a largest current passage opening, adjacent to the electrical contact layer.

In this vertical resonator laser diode, the first aperture layer, as seen from the active layer sequence, having the smallest current passage opening determines the size of the pumped active region. The aperture layer or layers disposed downstream of this first aperture layer, as seen from the active layer sequence, and having a larger current passage opening, reduce the effect of the current crowding in the vertical resonator laser diode because the current 13, before reaching the smallest current passage opening, is already pushed in a step-wise manner toward the optical axis (beam axis) of the laser diode, which runs through the pumped active region. The current crowding is thus reduced by gradually compacting the current 13 or in other words gradually increasing the current density towards the optical axis.

In a preferred embodiment, the aperture layers are composed of an oxidizable electrically conductive material which has a higher oxidation rate than the Bragg reflector layer sequences and which is oxidized except for the region of the respective current passage opening. Such aperture layers can, as already described above, be produced in a simple manner through the use of heat treatments or tempering processes in an oxygen-containing atmosphere.

In a particularly preferred embodiment of the vertical resonator laser diode, the aperture layers include $Al_xGa_{1-x}As$ where $0.8<x\leq 1$. In the case of such layers, the lateral oxidation rate during a heat treatment in a humid atmosphere depends on the Al content (the higher the Al content, the higher the oxidation rate) and, in the case of very thin layers (layer thicknesses of e.g. 5–10 nm), also on the layer thickness. "Lateral" oxidation rate means the oxidation depth per time unit in the case of a layer (in this case the $Al_xGa_{1-x}As$ aperture layer) to be oxidized, the layer being enclosed in a sandwich-like manner by two layers, the oxidation depth being measured from the free (exposed) end face of the layer, and the two "sandwich" layers which enclose the layer to be oxidized oxidizing not at all or considerably more slowly.

In a further particularly preferred embodiment of the vertical resonator laser diode, the aperture layers all have essentially the same composition and their layer thicknesses become smaller and smaller in the direction away from the active layer sequence toward the electrical contact layer. In this embodiment, the oxidation depths in the various aperture layers can advantageously be set accurately in a simple manner.

Preferably, the aperture layers are disposed in one of the Bragg reflector layer sequences, and the mirror pairs of this Bragg reflector layer sequence are each composed of an $Al_zGa_{1-z}As$ mirror layer having a refractive index n, and a thickness $d_z$ and a further mirror layer having a smaller refractive index than that of the $Al_zGa_{1-z}As$ mirror layer, where the further mirror layer is in each case composed of an $Al_xGa_{1-x}As$ layer 25 having a refractive index $n_x$ and the thickness $d_x$ and an $Al_yGa_{1-y}As$ layer 26 having a refractive index $n_y$ and a thickness $d_y$ with a different Al content x and y, and $x>y>z$ and the thickness of the individual layers is dimensioned in such a way that $n_xd_x+n_yd_y+n_zd_z\approx\lambda/2$, where $\lambda$ is the laser emission wavelength of the laser diode.

With the objects of the invention in view there is also provided, a method for producing a vertical resonator laser diode, the method includes the steps of providing an active layer sequence for generating a laser radiation; producing a Bragg reflector layer sequence having a plurality of mirror pairs and aperture layers forming a current aperture for concentrating an operating current flowing through the active layer sequence; and oxidizing the aperture layers from exposed surfaces of the aperture layers inward by heat-treating the Bragg reflector layer sequence in an oxygen-rich atmosphere for forming current passage openings in the aperture layers.

In accordance with another mode of the invention, the aperture layers is formed from an oxidizable electrically conductive material; and the aperture layers is oxidized, except in regions of the current passage openings.

In accordance with a further mode of the invention, the aperture layers are provided within the Bragg reflector layer sequence.

A preferred method for producing the vertical resonator laser diode according to the invention as explained above includes the steps of producing the Bragg reflector layer sequence with a plurality of mirror pairs and a plurality of $Al_xGa_{1-x}As$ aperture layers, where $0.8<x\leq 1$, each disposed between two mirror pairs, the layer thicknesses of the aperture layers become increasingly smaller in the direction away from the active layer sequence toward the electrical contact layer and are between 5 and 10 nm; and oxidizing the aperture layers from their exposed surfaces (end faces) inward by heat-treating the Bragg reflector layer sequence with the aperture layers in an oxygen-containing atmosphere.

Other features which are considered as characteristic for the invention are set forth in the appended claims.

Although the invention is illustrated and described herein as embodied in a vertical resonator laser diode and method for producing it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
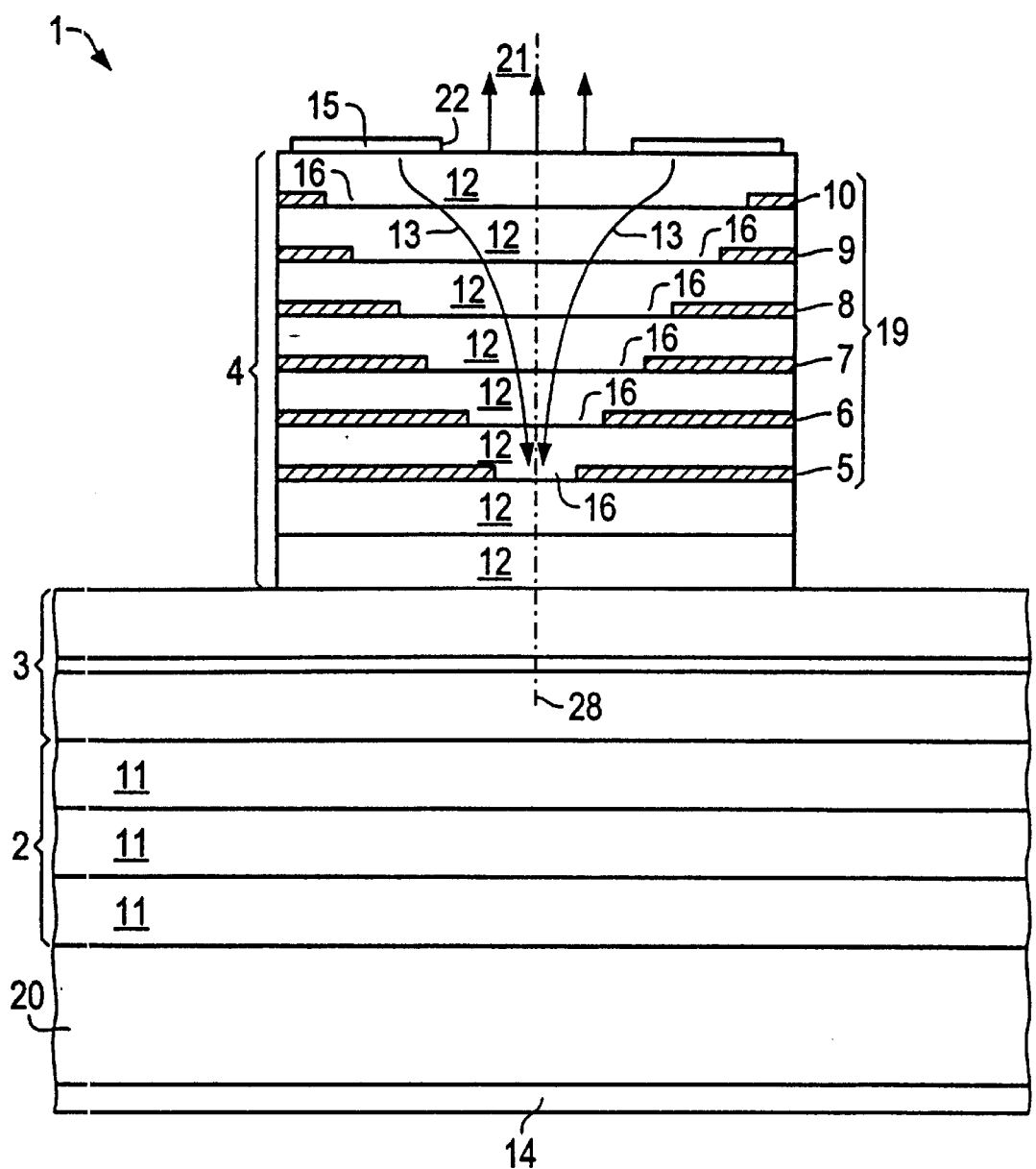
FIG. 1 is a diagrammatic cross-sectional view of an exemplary embodiment of a vertical resonator laser diode according to the invention.
Figure 2:
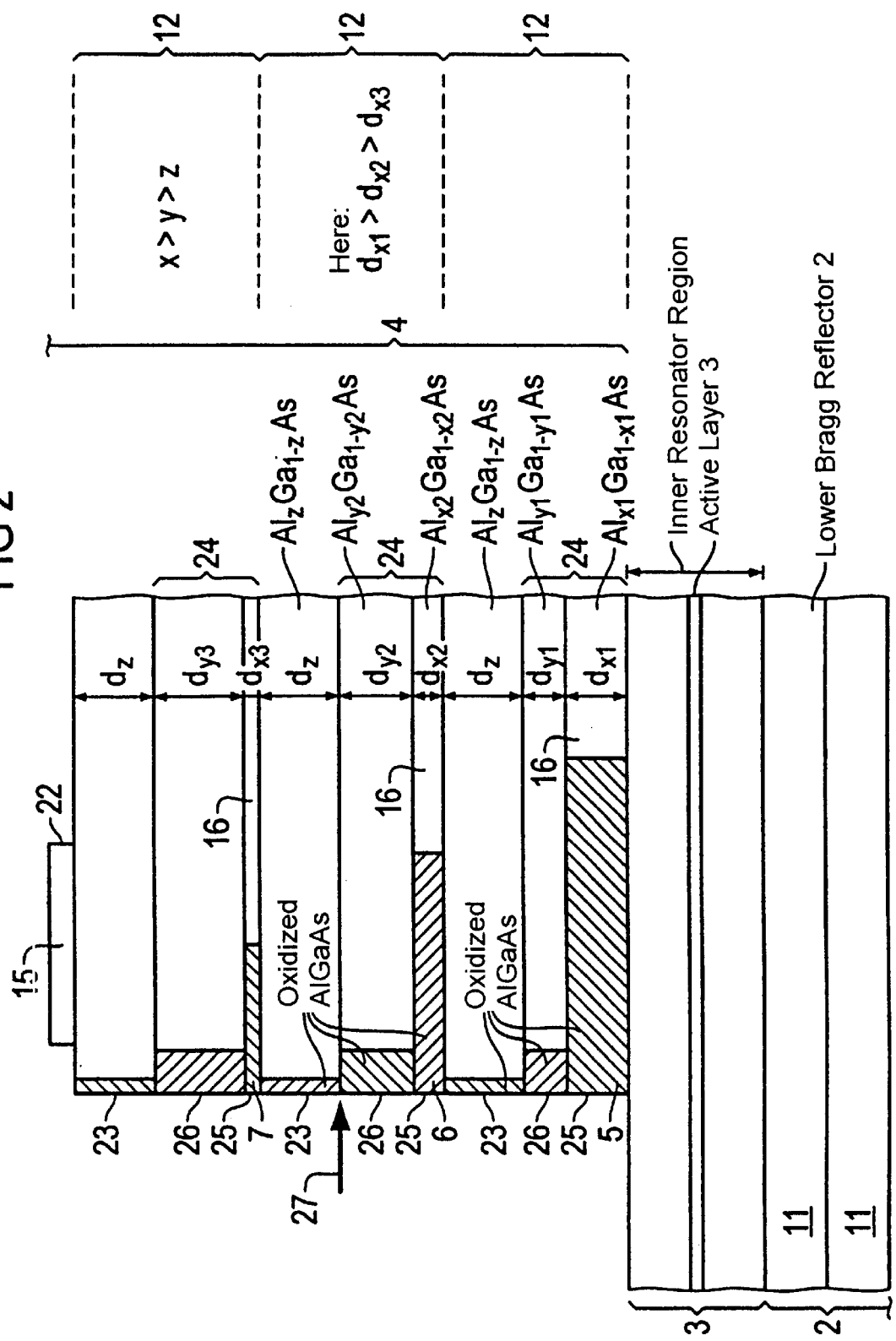
FIG. 2 is a fragmentary, diagrammatic cross-sectional view of an exemplary embodiment of a Bragg reflector layer sequence with aperture layers.
Figure 3:
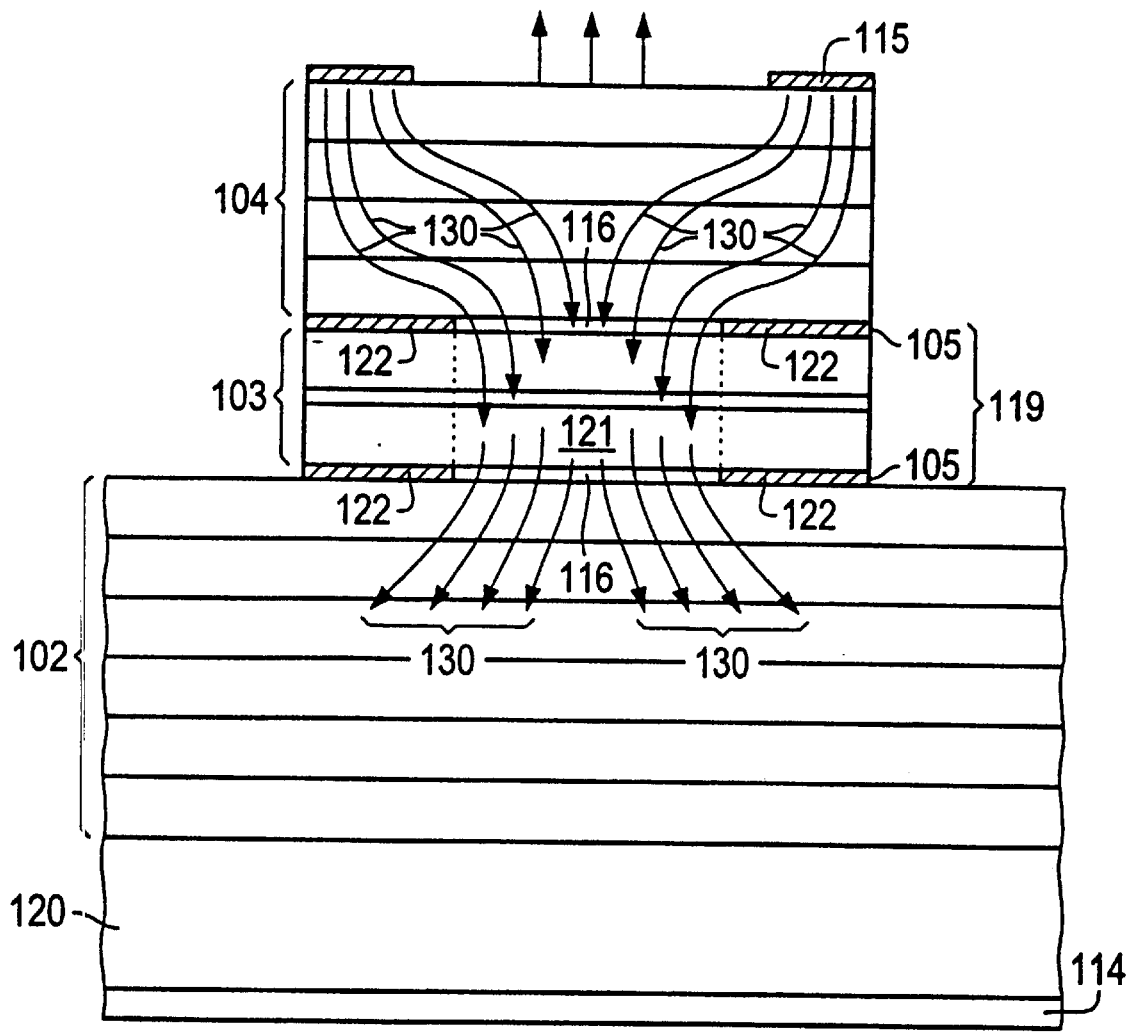
FIG. 3 is a diagrammatic cross-sectional view of a vertical resonator laser diode according to the prior art.

Referring now to the figures of the drawings in detail and first, particularly, to FIGS. 1 and 2 thereof, there is shown an exemplary embodiment of a vertical resonator laser diode according to the invention (FIG. 2 is a diagrammatic illustration of an upper Bragg reflector of a vertical resonator laser diode with an emission wavelength of approximately 850 nm). The vertical resonator laser diode according to the invention includes:

a semiconductor substrate 20, on which a plurality of epitaxially grown semiconductor layers is applied, which form a first Bragg reflector layer sequence 2 above the substrate 20. This first Bragg reflector layer sequence 2 is designated in the following as, "lower Bragg reflector 2";

an active layer sequence 3 over the lower Bragg reflector 2, the laser radiation 21 being generated in the active layer sequence during operation;

a second Bragg reflector layer sequence 4 over the active layer sequence 3, which has a plurality of epitaxially grown semiconductor layers. This second Bragg reflector layer sequence 4 is designated in the following as "upper Bragg reflector 4";

a first contact layer 14 (lower contact layer) on that side of the substrate 20 which is opposite to the lower Bragg reflector 2, and a second contact layer 15 (upper contact layer) on the upper Bragg reflector 4, which has an opening 22 through which the laser radiation 21 is coupled out from the laser diode 1; and a plurality of aperture layers 5–10 having current passage openings 16 of different sizes, the sizes of the current passage openings 16 of these aperture layers 5–10 increasing in the direction away from the active layer sequence 3 toward the electrical contact layer 15. These aperture layers together form the current aperture 19.

The individual components preferably include the following layers and materials:

Semiconductor substrate 20: GaAs, e.g. n-doped

Lower Bragg reflector 2: mirror pairs 11 made of $Al_yGa_{1-y}As$ e.g. n-doped

Active layer sequence 3: active quantum films with the corresponding barrier and cladding layers (material dependent on the desired wavelength of the laser radiation, preferably III/V or II/VI semiconductor material)

Upper Bragg reflector 4: mirror pairs 12 made of $Al_zGa_{1-z}As$ e.g. p-doped

Contact layers 14, 15: contact metallization layers, e.g. made of AuBe/Ti/Au and AuGe/Ti/Au, respectively, Aperture layers 5–10: $Al_xGa_{1-x}As$ where $0.8 < x \leq 1$ (partially oxidized) and layer thicknesses of between 5 and 10 nm.

Preferably, the aperture layers 5–10 all have essentially the same composition. Their layer thicknesses $d_x$ become smaller and smaller as seen from the active layer sequence 3 in the direction of the upper contact layer 15. They are each oxidized except for the region of the respective current passage opening 16 and therefore have a very high electrical resistance outside the current passage opening 16. Varying the layer thickness $d_x$, as already mentioned further above, enables the size of the current passage opening 16 of one of the aperture layers 5–10 to be adjusted. The size of the current passage opening 16 can be better controlled by a variation of the layer thickness than by a variation of the composition x in the aperture layers 5–10.

The upper Bragg reflector 4 contains $Al_zGa_{1-z}As$ mirror layers 23 having a relatively high refractive index $n_z$ and a correspondingly low Al content z. The layer thickness $d_z$ ideally corresponds to a quarter of the laser emission wavelength λ in the $Al_zGa_{1-z}As$ layer 23 ($d_z=\lambda/4$ for the layer having a refractive index of $n_z$).

The mirror layers 24 of the upper Bragg reflector 4 having a lower refractive index than that of the $Al_zGa_{1-z}As$ mirror layers 23 are composed of in each case an $Al_xGa_{1-x}As$ layer 25 having a refractive index $n_x$ and an $Al_yGa_{1-y}As$ layer 26 having a refractive index $n_y$ with a different Al content x and y, where x>y>z. The thickness of the individual layers is dimensioned in such a way that $n_xd_x+n_yd_y+n_zd_z=\lambda/2$.

Two mirror layers 23, 24 having a high and a low refractive index in each case form the mirror pairs 12 of the upper Bragg reflector 4. In the simplified illustration in FIG. 2, intermediate layers or gradual transitions between the individual layers, which are typically provided for the purpose of reducing the electrical resistance, are not taken into consideration.

All of the AlGaAs layers 23, 25, 26 of the upper Bragg reflector 4 are oxidized, starting from their side face, into the interior of the Bragg reflector, which is indicated by the arrow 27. The $Al_xGa_{1-x}As$ layers, which have the highest Al content, have the largest oxidation depth, while the $Al_yGa_{1-y}As$ and $Al_zGa_{1-z}As$ layers are oxidized to a much smaller depth into the interior of the upper Bragg reflector 4. Accordingly, the oxidized $Al_xGa_{1-x}As$ layers define the current passage openings 16 of the aperture layers 5–10.

The $Al_xGa_{1-x}As$ layer 25 having the largest thickness $d_{x1}$ oxidizes faster than the thinner $Al_xGa_{1-x}As$ layers 25 having the layer thicknesses $d_{x2}$, $d_{x3}$. . . etc. The depth of the oxidation front and thus the diameter of the current passage openings 16 can thus be set by way of the layer thicknesses $d_x$. The position of the $Al_xGa_{1-x}As$ layer 25 having the largest thickness $d_{x1}$ must be optimized for the vertical resonator laser diodes.

It is possible, as illustrated in FIG. 1, to provide further mirror pairs 12 between the $Al_xGa_{1-x}As$ layer 25 having the largest thickness $d_{x1}$ and the active layer sequence. These mirror pairs 12 could also in turn contain $Al_xGa_{1-x}As$ layers, which, however, would have a thickness less than $d_{x1}$.

In vertical resonator laser diodes, the smallest current passage opening 16 of the aperture layer 5 having the largest thickness $d_{x1}$ determines the size of the pumped active region, disregarding current expansion behind the current passage openings 16. By way of example, in the upper Bragg reflector 4, one or more additional aperture layers 6–10 with a larger diameter of the associated current passage openings 16 are disposed above this aperture layer 5. The additional aperture layers 6–10 reduce the effect of current crowding in the vertical resonator laser diode because the current is, before reaching the smallest current passage opening 16 of the aperture layer 5, already concentrated or "pushed" toward the central axis 28 of the upper Bragg reflector 4.

The size of the current passage openings 16 of the aperture layers 5–10 is in this case set preferably by way of their thicknesses $d_{x1}$, $d_{x2}$, $d_{x3}$... of the $Al_xGa_{1-x}As$ layers 25, which affords a better controllability of the oxidation depths than a variation of the Al content of these layers, which is, in principle, also possible. Epitaxial growth is simpler because the composition of the compound semiconductors remains constant and only the growth time is varied. The constant composition also ensures a constant refractive index, which is advantageous for controlling the optical layer thicknesses in the laser resonator.

The exemplary embodiment described above positions a current aperture 19 only in the upper Bragg reflector 4. However, it is also possible to dispose a current aperture 19 only in the lower Bragg reflector 2, or to dispose a respective current aperture 19 in each of the two the Bragg reflectors 2 and 4.

In a preferred method for producing the vertical resonator laser diode according to the exemplary embodiment, first of all the lower Bragg reflector 2, the active layer sequence 3 and the upper Bragg reflector 4 are applied epitaxially to the substrate 20. Then, the contact layers 14 and 15 are deposited onto the substrate 2 and onto the upper Bragg reflector 4, respectively. An oxidation 27 of this entire layer structure is subsequently performed through the use of a heat treatment in a humid atmosphere.

I claim:

1. A vertical resonator laser diode, comprising
   a laser resonator having a first Bragg reflector layer sequence and a second Bragg reflector sequence, said first and second Bragg reflector layer sequences each having a plurality of mirror pairs;
   an active layer sequence disposed between said first and second Bragg reflector layer sequences for generating a laser radiation, said active layer sequence having a pumped active region and having a side, one of said first and second Bragg reflector layer sequences being partially transmissive for the laser radiation;
   a first electrical contact layer and a second electrical contact layer, said first and second Bragg reflector layer sequences and said active layer sequence being disposed between said first and second electrical contact layers;
   a current aperture provided at least on said side of said active layer sequence for limiting said pumped active region of said active layer sequence by concentrating an operating current flowing through said active layer sequence during a laser operation, said current aperture including aperture layers disposed between one of said first and second electrical contact layers and said active layer sequence, said aperture layers being formed with current passage openings having different sizes, said sizes of said current passage openings increasing in a direction away from said active layer sequence toward one of said first and second electrical contact layers;
   each of said plurality of mirror pairs including:
       an $Al_zGa_{1-z}As$ mirror layer having a first aluminum content z, a first refractive index $n_z$ and a first thickness $d_z$;
       a further mirror layer having a second refractive index smaller than said first refractive index $n_z$ of said $Al_zGa_{1-z}As$ mirror layer, said further mirror layer including an $Al_xGa_{1-x}As$ layer and an $Al_yGa_{1-y}As$ layer;
       said $Al_xGa_{1-x}As$ layer having a second aluminum content x, a third refractive index $n_x$ and a second thickness $d_x$;
       said $Al_yGa_{1-y}As$ layer having a third aluminum content y, a fourth refractive index $n_y$ and a third thickness $d_y$;
       said first aluminum content z being smaller than said third aluminum content y, said third aluminum content y being smaller than said second aluminum content x; and
       said first, second, and third thicknesses $d_z$, $d_x$, $d_y$ and said first, third, and fourth refractive indexes $n_z$, $n_x$, $n_y$ being dimensioned such that $n_xd_x+n_yd_y+n_zd_z \approx \lambda/2$, where $\lambda$ is a laser emission wavelength.

2. The vertical resonator laser diode according to claim 1, wherein said aperture layers include oxidizable electrically conductive material, said oxidizable electrically conductive material being oxidized except where said current passage openings are formed.

3. The vertical resonator laser diode according to claim 1, wherein said aperture layers include $Al_xGa_{1-x}As$ where $0.8 < x \leq 1$.

4. The vertical resonator laser diode according to claim 1, wherein said aperture layers have layer thicknesses decreasing in a direction away from said active layer sequence toward one of said first and said second electrical contact layers and wherein said aperture layers have essentially identical compositions.

5. The vertical resonator laser diode according to claim 1, wherein said aperture layers are disposed in one of said first and said second Bragg reflector layer sequences.

6. A method for producing a vertical resonator laser diode, the method which comprises:
   providing an active layer sequence for generating a laser radiation;
   producing a Bragg reflector layer sequence having a plurality of mirror pairs and aperture layers forming a current aperture for concentrating an operating current flowing through the active layer sequence;
   oxidizing the aperture layers from exposed surfaces of the aperture layers inward by heat-treating the Bragg reflector layer sequence in an oxygen-rich atmosphere for forming current passage openings in the aperture layers;
   providing each of the plurality of mirror pairs with an $Al_zGa_{1-z}As$ mirror layer having a first aluminum content z, a first refractive index $n_z$ and a first thickness $d_z$ and with a further mirror layer having a second refractive index smaller than the first refractive index $n_z$ of the $Al_zGa_{1-z}As$ mirror layer;
   providing the further mirror layer with an $Al_xGa_{1-x}As$ layer and with an $Al_yGa_{1-y}As$ layer, the $Al_xGa_{1-x}As$ layer having a second aluminum content x, a third refractive index $n_x$ and a second thickness $d_x$, the $Al_yGa_{1-y}As$ layer having a third aluminum content y, a fourth refractive index $n_y$ and a third thickness $d_y$, the first aluminum content z being smaller than the third aluminum content y, the third aluminum content y being smaller than the second aluminum content x; and
   dimensioning the first, second, and third thicknesses $d_z$, $d_x$, $d_y$ and the first, third and fourth refractive indexes $n_z$, $n_x$, $n_y$ such that $n_xd_x+n_yd_y+n_zd_z \approx \lambda/2$, where $\lambda$ is a laser emission wavelength.

7. The method according to claim 6, which comprises:
   forming the aperture layers from an oxidizable electrically conductive material; and
   oxidizing the aperture layers except in regions of the current passage openings.

8. The method according to claim 6, which comprises forming the aperture layers from $Al_xGa_{1-x}As$ where $0.8 < x \leq 1$.

9. The method according to claim 6, which comprises forming the aperture layers from essentially identical materials and with thicknesses decreasing in a direction away from the active layer sequence.

10. The method according to claim 6, which comprises providing the aperture layers within the Bragg reflector layer sequence.

11. A vertical resonator laser diode, comprising:
    a laser resonator having a first Bragg reflector layer sequence and a second Bragg reflector layer sequence, said first and second Bragg reflector layer sequences each having a plurality of mirror pairs;
    an active layer sequence disposed between said first and second Bragg reflector layer sequences for generating laser radiation, said active layer sequence having a pumped active region and having a side, one of said first and second Bragg reflector layer sequences being partially transmissive for the laser radiation;

a first electrical contact layer and a second electrical contact layer, said first and second Bragg reflector layer sequences and said active layer sequence being disposed between said first and second electrical contact layers;

a current aperture provided at least on said side of said active layer sequence for limiting said pumped active region of said active layer sequence by concentrating an operating current flowing through said active layer sequence during a laser operation, said current aperture including aperture layers disposed between one of said first and second electrical contact layers and said active layer sequence, said aperture layers having current passage openings formed therein with different sizes, said different sizes of said current passage openings increasing in a direction away from said active layer sequence toward one of said first and second electrical contact layers;

at least two of said plurality of mirror pairs including:
  an $Al_zGa_{1-z}As$ mirror layer having a first aluminum content z, a first refractive index $n_z$ and a first thickness $d_z$;
  a further mirror layer having a second refractive index smaller than said first refractive index $n_z$ of said $Al_zGa_{1-z}As$ mirror layer, said further mirror layer including an $Al_xGa_{1-x}As$ layer and an $Al_yGa_{1-y}As$ layer;
  said $Al_xGa_{1-x}As$ layer having a second aluminum content x, a third refractive index $n_x$ and a second thickness $d_x$;
  said $Al_yGa_{1-y}As$ layer having a third aluminum content y, a fourth refractive index $n_y$ and a third thickness $d_y$;
  said first aluminum content z being smaller than said third aluminum content y, said third aluminum content y being smaller than said second aluminum content x; and said first, second, and third thicknesses $d_z$, $d_x$, $d_y$ and said first, third, and fourth refractive indexes $n_z$, $n_x$, $n_y$ being dimensioned such that $n_x d_x + n_y d_y + n_z d_z \approx \lambda/2$, where $\lambda$ is a laser emission wavelength.

12. A method for producing a vertical resonator laser diode, the method which comprises:

providing an active layer sequence for generating laser radiation;

producing a Bragg reflector layer sequence having a plurality of mirror pairs and aperture layers forming a current aperture for concentrating an operating current flowing through the active layer sequence;

oxidizing the aperture layers from exposed surfaces of the aperture layers inward by heat-treating the Bragg reflector layer sequence in an oxygen-rich atmosphere for forming current passage openings in the aperture layers;

providing at least two of the plurality of mirror pairs with an $Al_zGa_{1-z}As$ mirror layer having a first aluminum content z, a first refractive index $n_z$ and a first thickness $d_z$ and with a further mirror layer having a second refractive index smaller than the first refractive index $n_z$ of the $Al_zGa_{1-z}As$ mirror layer;

providing the further mirror layer with an $Al_xGa_{1-x}As$ layer and with an $Al_yGa_{1-y}As$ layer, the $Al_xGa_{1-x}As$ layer having a second aluminum content x, a third refractive index $n_x$ and a second thickness $d_x$, the $Al_yGa_{1-y}As$ layer having a third aluminum content y, a fourth refractive index $n_y$ and a third thickness $d_y$, the first aluminum content z being smaller than the third aluminum content y, the third aluminum content y being smaller than the second aluminum content x; and dimensioning the first, second, and third thicknesses $d_z$, $d_x$, $d_y$ and the first, third and fourth refractive indexes $n_z$, $n_x$, $n_y$ such that $n_x d_x + n_y d_y + n_z d_z \approx \lambda/2$, where $\lambda$ is a laser emission wavelength.

* * * * *